United States Patent
Voevodin et al.

(10) Patent No.: US 6,509,070 B1
(45) Date of Patent: Jan. 21, 2003

(54) LASER ABLATION, LOW TEMPERATURE-FABRICATED YTTRIA-STABILIZED ZIRCONIA ORIENTED FILMS

(75) Inventors: Andrey A. Voevodin, Dayton, OH (US); John G. Jones, Dayton, OH (US); Jeffrey S. Zabinski, Yellow Springs, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/867,997

(22) Filed: May 29, 2001

Related U.S. Application Data

(60) Provisional application No. 60/234,476, filed on Sep. 22, 2000.

(51) Int. Cl.[7] .................................................. H05H 1/00
(52) U.S. Cl. ....................... 427/572; 427/576; 427/458; 427/596
(58) Field of Search .............................. 427/596, 419.2, 427/419.3, 62, 126.3, 63, 597, 523–531, 255.11, 255.19, 255.23, 255.31, 255.32, 255.36, 533, 535, 569, 570, 572, 573, 576, 458; 505/474, 477, 432, 480, 238, 730, 702, 701; 117/944; 204/298.13

(56) References Cited

U.S. PATENT DOCUMENTS

| | | | |
|---|---|---|---|
| 5,217,748 A | * | 6/1993 | Kestelman et al. ......... 427/580 |
| 5,330,968 A | | 7/1994 | Nagaishi et al. |
| 5,368,681 A | * | 11/1994 | Hiraoka et al. ............. 427/585 |
| 5,432,151 A | * | 7/1995 | Russo et al. ................ 505/474 |
| 5,479,317 A | * | 12/1995 | Ramesh .................... 361/321.5 |
| 5,607,899 A | * | 3/1997 | Yoshida et al. ............. 505/474 |
| 5,652,044 A | * | 7/1997 | Rickerby .................... 428/216 |
| 5,849,373 A | * | 12/1998 | Barbour et al. ............. 427/576 |
| 5,851,475 A | * | 12/1998 | Komvopoulos et al. .... 264/430 |
| 5,858,478 A | * | 1/1999 | Radhakrishnan ............ 427/571 |
| 6,149,777 A | * | 11/2000 | Ngan et al. ............ 204/192.17 |

* cited by examiner

Primary Examiner—Timothy Meeks
Assistant Examiner—Eric B Fuller
(74) Attorney, Agent, or Firm—Gerald B. Hollins; Thomas L. Kundert

(57) ABSTRACT

Formation of for example yttria stabilized zirconia films of significant 001 orientation on a variety of substrates including amorphous material and room temperature limited material is disclosed. The yttria stabilized zirconia film formation is achieved using pulsed laser ablation of a polycrystalline yttria stabilized zirconia target source while the substrate is electrically biased, disposed at a selected angle and maintained at substantially room temperature in the presence of an argon atmosphere. The film formation uses low bias voltage, requires no ion beam apparatus and employs low temperatures sufficient only to enable process stabilization. Film formation is accomplished in a step sequence wherein each step responds to temporal and spatial component segregations occurring in a laser-ablated ion plume.

30 Claims, 8 Drawing Sheets

LASER ABLATION, LOW TEMPERATURE-FABRICATED YTTRIA-STABILIZED ZIRCONIA ORIENTED FILMS

CROSS REFERENCE TO RELATED APPLICATION

This application claims the benefit of U.S. Provisional Application No. 60/234,476, filed Sep. 22, 2000.

RIGHTS OF THE GOVERNMENT

The invention described herein may be manufactured and used by or for the Government of the United States for all governmental purposes without the payment of any royalty.

BACKGROUND OF THE INVENTION

This invention relates to pulsed laser-deposited highly oriented yttria stabilized zirconia thin films fabricated on a plurality of substrate types.

Currently there is a great interest in the growth of highly oriented yttria stabilized zirconia (YSZ) films with specific electrical, mechanical, and optical properties. Oriented YSZ film applications range from dielectric buffer layers for yttria barium copper oxide (YBCO) superconductors to hard films used for wear protection in tribological (abrasion resistant) pairs. Laser ablation is one of the few YSZ deposition methods providing technological and economical solutions for growing the desirable <001> oriented cubic and tetragonal YSZ films on polycrystalline substrates.

The growth of YSZ films by pulsed laser deposition (PLD) is currently typically accomplished in an oxygen background of $10^{-4}$ to $10^{-2}$ mbar pressure range, while the substrate temperature is maintained at about 800° C. These conditions cause a thermally driven oxidation for the growth of stoichiometrically correct, <001> equi-axial and in-plane oriented films. The background gas not only affects the chemistry on the substrate condensation surface, but also determines the chemistry and energetics within the ablation plume itself.

The fabrication of YSZ films is thus known in the art however in the past these films have been formed at temperatures requiring the use of non organic substrate materials; moreover these substrate materials are often required to be of a specific crystal orientation if a particular crystal orientation is desired in the fabricated film material. Similarly it is known in the art to employ a bias voltage on the substrate used to support a ceramic film during film fabrication, such bias voltages are however frequently used in a sputtering film-forming environment rather than in an ablation film-forming environment. Similarly the use of argon gas in forming a ceramic film is known in the art, however such gas is often seen in the form of ions in a beam rather than as a significant gaseous component in a laser ablation atmosphere. It is also known to employ ion bombardment in the fabrication of a ceramic film; such bombardment is however most commonly accomplished through use of an ion beam apparatus rather than through the laser ablation espoused in the present invention. Several aspects relating to the present invention are therefore known in their own right in the ceramic film art; the present invention however is believed to represent a new and particularly useful combination of such aspects and thereby to result in an advancement of the ceramic film art.

SUMMARY OF THE INVENTION

The present invention provides [001] oriented yttria stabilized zirconia films achieved at low temperature and in an ion beam-free processing sequence.

It is an object of the present invention therefore to provide a relatively low temperature process for achieving yttria stabilized zirconia films.

It is another object of the present invention therefore to provide a relatively low temperature process for achieving highly oriented yttria stabilized zirconia films.

It is another object of the present invention to provide an ion beam-free low temperature accelerated ion process for achieving yttria stabilized zirconia and related films.

It is another object of the present invention to provide an ion beam-free, low temperature, accelerated ion process for achieving yttria stabilized zirconia and related films.

It is another object of the present invention to provide a ceramic film-related ablation process operable with continuous direct current electrical energy.

It is another object of the present invention to provide a ceramic film-related ablation process operable with pulsating direct current electrical energy.

It is another object of the present invention to provide an improved yttria stabilized zirconia film fabrication process based on an enhanced degree of plasma diagnosis relevant to a laser ablation process.

It is another object of the present invention to provide an improved yttria stabilized zirconia film fabrication process based on a desirable degree of plasma formation achieved in a particular formation atmosphere.

It is another object of the present invention to provide an improved yttria stabilized zirconia film achieved through use of newly recognized advantageous combinations of film formation atmosphere composition, atmospheric pressure and atmospheric temperature.

It is another object of the present invention to provide an improved yttria stabilized zirconia film achieved through the use of advantageous combinations of argon and other gases in the film-formation atmosphere.

It is another object of the present invention to provide an improved yttria stabilized zirconia film achievable within realistic practical processing times.

It is another object of the present invention to provide an improved yttria stabilized zirconia film achieved with the use of random oriented yttria stabilized zirconia as an ablation material.

It is another object of the present invention to provide an improved yttria stabilized zirconia film achieved with the use of commercially available polycrystalline yttria stabilized zirconia as an ablated material.

It is another object of the present invention to provide an improved yttria stabilized zirconia film formable on a large variety of substrate materials, materials inclusive of metals, ceramics, plastics and low temperature compositions.

It is another object of the present invention to provide an improved yttria stabilized zirconia film formable on substrate materials of any Miller indices surface orientation, including random and amorphous surfaces.

It is another object of the present invention to utilize the advantages of an inclined substrate for receiving the forming yttria stabilized zirconia film.

Additional objects and features of the invention will be understood from the following description and claims and the accompanying drawings.

These and other objects of the invention are achieved by the method of forming oriented yttria stabilized zirconia films comprising the steps of:

disposing a target source of polycrystalline yttria stabilized zirconia in a closed atmosphere of selected gaseous composition, flow rate, temperature and pressure;

locating a film-receiver substrate of selected composition in said closed atmosphere of selected gaseous composition, temperature and pressure;

ablating a segregated plume of zirconium ions and remainder plasma from a surface portion of said polycrystalline yttria stabilized zirconia target source using energy emissions from a laser of selected operational characteristics;

said substrate being disposed in a selected angular orientation with respect to a straight line path joining said substrate and said target source of polycrystalline yttria stabilized zirconia;

attracting said zirconium ions and said remainder plasma toward said substrate by lowering said substrate in electrical potential below that of said polycrystalline yttria stabilized zirconia target source.

DETAILED DESCRIPTION

Figure 1:
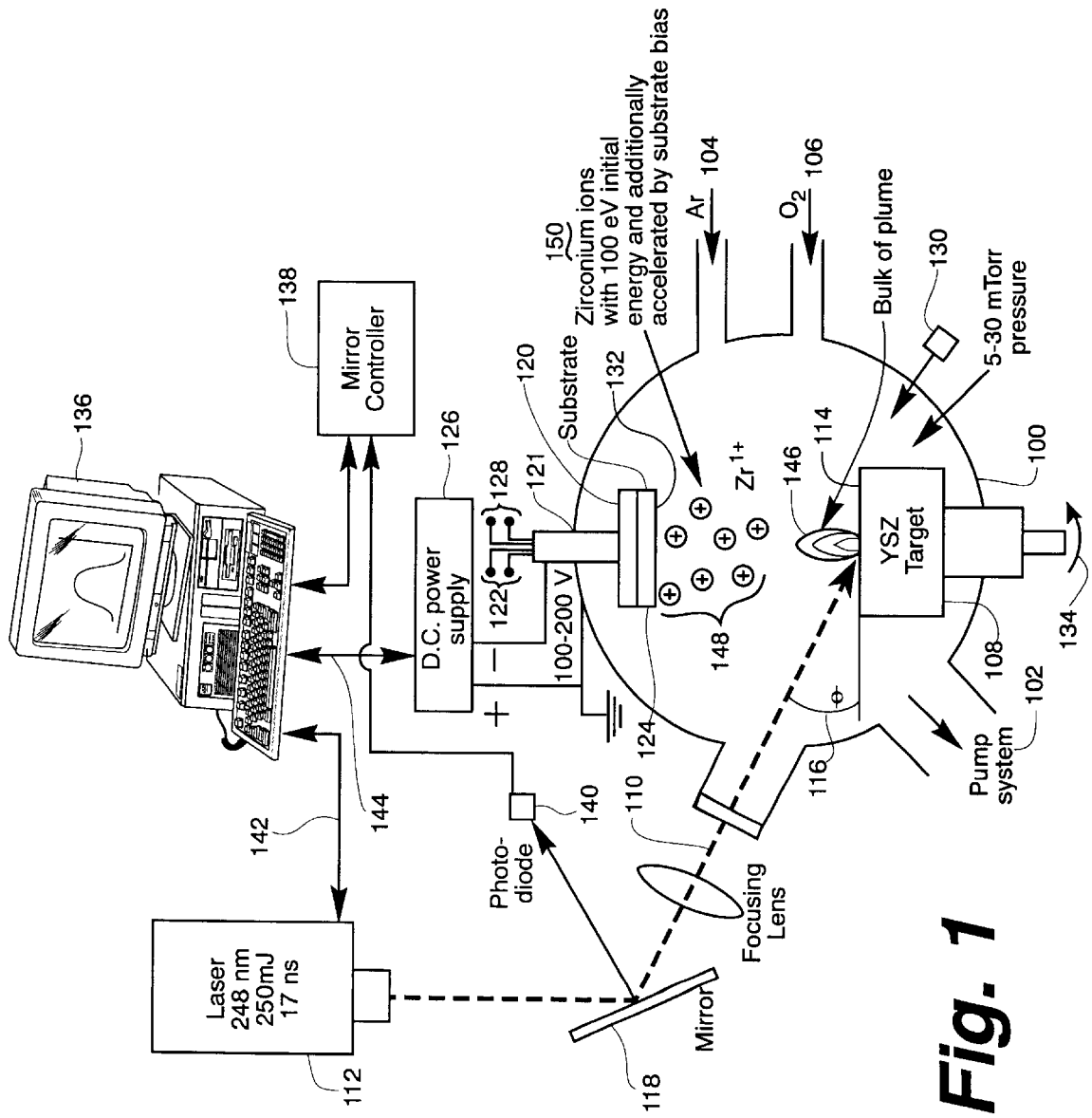
FIG. 1 shows a laser ablation yttria-stabilized zirconia oriented film fabrication, low temperature apparatus according to the present invention.

There is substantial technical community interest in yttria stabilized zirconia (YSZ) films, films in which crystal structure is oriented along the [001] direction normal to the substrate surface. Such highly textured films are for example used in superconductor manufacturing as buffer layers for subsequent epitaxial growth of yttria barium copper oxide superconductor (YBCO) films—as is disclosed in the publications numbered one through four i. e. , [1–4] in the reference list included below herein. Each of these reference list documents is hereby incorporated by reference herein. YSZ films with [001] texture may also provide new benefits for tribological applications requiring atomically smooth surfaces, while the high hardness and thermal stability of YSZ has already attracted attention for surface wear protection [5–7]. A review of the methods for growing such highly oriented YSZ films has indicated pulsed laser deposition (PLD) as one of the most technologically versatile and economically acceptable of the available methods [8].

Consideration of the processes for PLD growth of [001] oriented YSZ films indicates however the existing film growth methods have limitations and processing difficulties. Existing methods of YSZ film structure control may for example be classified briefly as: 1) regulation of film deposition temperature, where temperatures as high as 700–800° C. are found to be optimum [2, 3, 9–11]; 2) use of (200) pre-textured substrates, e. g. Si wafers [10], Ni tapes [12] or Hastelloy (Ni—Cr—Mo alloy) substrates [11] for high temperature nucleation and growth; 3) use of substrate inclinations to 45° of angle with incoming laser ablated plasma together with deposition temperatures of about 800° C. [13,14]; 4) ion-beam assisted PLD with Argon (Ar) or Argon/Oxygen (Ar/O$_2$) ion bombardment of the film condensation surface under an optimized angle to produce the desirable structure at deposition temperatures of 50–150° C. [15–18]. As a rule, oxygen rich environments have been used to facilitate thermo chemical growth of YSZ films in high temperature deposition methods (1) to (3).

These four methods have limitations which may be attributed to: 1) high deposition temperatures, temperatures which for example limit substrate selection; 2) the need for ion-beam assistance, assistance tending to increase process complexity; 3) the use of only (002) pre-textured substrates during both high temperature and ion-beam assisted depositions (such substrates are by selection and of increased substrate processing complexity). The present invention overcomes these difficulties by achieving YSZ [001] growth on a substrate (including metal, ceramic, organic material, glass and polymer films at low substrate temperature and without the use of an ion-beam source.

In general PLD processes provide a relatively low degree of ionization of the ablated material, this ionization however can be desirably increased by optimization of the ionization background gas environment. More precisely, we have discovered a multifold enhancement of the YSZ plume ionization for ablations accomplished in a low pressure Ar environment. This effect is related to improvement in collision cross-section ionization of Zr atoms with Ar atoms, in comparison to collision cross-section ionization of the Zr atoms with oxygen molecules in the usual oxygen ablation environment. It has also been found that under selected conditions ablated $Zr^{1+}$ ions can escape energy attenuation within the near target Knudsen layer and also can arrive at the substrate prior to other ionization plume components. The Knudsen layer defines a region in front of the target wherein collisionional exchanges between ablated particles bring particle velocities to an equilibrium average, i. e. , it is a velocity attenuation effect. The Knudsen layer is further defined in the reference text, "Laser Deposition of Thin Films" by D. B. Chrisey and G. K. Hubler, Wiley, N.Y. 1994, see the page 73 article "Mechanisms of Pulsed Laser Sputtering" by R. Kelly, A. Miotello.

Since PLD can be viewed as an interrupted deposition process with multiple repetitions, subsequent pulsed bombardment of the deposited films with $Zr^{1+}$ ions can also be achieved with substrate negative bias. Such bias contributes to achieving structure control similar to that obtained by ion-beam assisted PLD but does not required a separate ion-beam source and is more efficient, since it permits growth of [001] films on randomly oriented substrates.

Apparatus and Property Evaluation Methods

An arrangement according to the present invention for growing [001] oriented YSZ films is shown in FIG. 1 of the drawings herein. In using this FIG. 1 apparatus depositions are performed in an ultra high vacuum (UHV)-compatible chamber 100, evacuated by a turbo pump system 102 to less than $10^{-6}$ Pascal residual pressure and filled with a 0.1 to 1.0 Pascal Ar or Ar/O$_2$ mixture introduced at 104 and 106. In the FIG. 1 apparatus films are grown by laser ablation of a ZrO$_2$/5 wt. % Y$_2$O$_3$ target 108 with a 248 nanometer laser beam 110 produced with a pulsed laser 112, for example with a Lambda Physic LPX100 excimer laser. Laser beam pulses of typically 250 millijoules energy level, 17 nanoseconds duration, and 40 Hertz repetition rate are focused on the FIG. 1 target surface 114 to achieve a single pulse energy density of 10 Joules per square centimeter. A laser beam incidence angle 116 of about 35 degrees to the target surface may be used and the beam randomly scanned with a set of high speed mirrors 118; the target 114 may also be rotated as indicated at 134, thus ensuring that each ablation spot is different from the area ablated and heated by the previous pulse. The FIG. 1 substrate holder 120 may be located between two and thirteen centimeters directly above the target surface 114, a distance of seven centimeters being preferred. The substrate 124 may be heated with a hot filament enclosed in the substrate holder 120 and energized by the set of filament leads 122.

Deposition temperature in the FIG. 1 apparatus is preferably controlled to within 5° C. accuracy in a 100–300° C. range and is based on readings from a thermocouple located in the substrate holder 120 and accessed by way of leads 128. An infrared sensor 130 focused on the film condensation surface 132 of the substrate 124 may be used to supplement or possibly replace the thermocouple temperature control. The substrate 124 may be negatively biased to the FIG. 1 indicated 100–200 volt negative potential using a D.C. power supply 126. The substrate holder 120 is electrically isolated from the metal of the chamber 100 by way of a pressure tight electrical insulating seal assembly or the like as is indicated at 121 in FIG. 1. As represented in FIG. 1 both the chamber 100 and the target 108 are connected to the positive terminal of the power supply 126 however a direct connection of the positive terminal to the target 108, a second seal assembly and an electrical floating of target 108 and substrate holder 120 with respect to chamber 100 may be used. The power supply 126 may be operated in a constant voltage manner when a metal substrate is used or in a pulsed manner, with small reverse polarity times and voltages, when a non-metallic substrate is used (in order to attract negative plasma ions and thereby neutralize accumulated substrate positive charge). Power supplies capable of these conductive and non-conductive substrate operating regimes are commercially available.

The FIG. 1 substrate 124 may be a 2.54 cm diameter, surface polished disk and made of 440 C stainless steel or alternately may be a single crystal <100> Si wafer. Other substrate materials may be used as is indicated elsewhere herein. A YSZ film thickness of approximately 1.2 micrometers may be achieved in about 30 minutes of ablation exposure in the described FIG. 1 apparatus. For convenience the FIG. 1 drawing shows the substrate holder 120 to be disposed perpendicular to the path of the substrate-directed ions 150, i. e., the substrate-directed ions are arriving along the normal to the substrate holder 120 in the FIG. 1 view. As discussed later herein, and also as shown in the FIG. 8 drawing, an alternate angle of 55 degrees between the substrate-directed ions and the substrate normal offers an advantage with respect to achieved crystal size and may be preferable in some uses of the invention. Such an arrival angle may of course be obtained by tilting the substrate holder 120 from the orientation shown in FIG. 1.

A suitably programmed digital computer as indicated at 136 may be used to control the FIG. 1 apparatus in order that a minimum of human oversight and a desirable degree of repeatability and consistency be achieved. The computer 136 may control the high-speed mirrors 118 through a signal-amplifying controller 138, which also receives mirror position, and laser beam intensity feedback signals from a photodiode 140. The computer 136 may also be used to control the surface temperature of the substrate 124 through use of an additional controller not shown in FIG. 1 but connected between the computer 136 and the leads 122 and 128. As indicated by the bi-directional paths 142 and 144, the computer 136 may additionally control the laser 122 and the power supply 126—also preferably with the assistance of intervening amplifier/controller circuits. The target 108 rotation indicated at 134 may also be controlled from the computer 136 with respect to rotation rate and start and stop control if desired. Software for use in the computer 136 may consist of an adapted version of the LabVIEW platform available from National Instruments Corporation of Austin Tex. (http://www.ni.com/).

A Yttrium and Zirconia plume formed by a presently active pulse from the laser 112 in the FIG. 1 ablation is represented at 146 in the FIG. 1 drawing. The Zirconia ions from a previous plume and previous pulse of the laser 112, positively charged ions accelerating toward the negative potential substrate 124, are represented at 148 in the FIG. 1 drawing. Additional details regarding such spatial and temporal segregations of laser ablation plume components, including details relating to the present materials, are disclosed in FIG. 8 and the related materials below and in the technical journal publication "Characterization of $ZrO_2$ laser ablation plasma in vacuum, oxygen, and argon environments" by A. A. Voevodin, J. G. Jones and J. S. Zabinski appearing in the Journal of Applied Physics published by the American Institute of Physics, volume 88, number 2, Jul. 15, 2000, pages 1088–1096. This article includes discussion relating to observed characteristics of the present invention materials and to the color filters and other techniques used to observe temporal and spatial segregation characteristics. This article is hereby incorporated by reference herein. The two components of energy attributable to the FIG. 1 ions 148 are indicated at 150 in the FIG. 1 drawing; additional aspects regarding this ion energy level are disclosed below herein.

Film composition achieved with the FIG. 1 apparatus may be investigated with, for example, a Surface Science Instruments M-Probe x-ray photoelectron spectrometer (XPS). Relative peak areas may be used for compositional quantification and are preferably corrected for the spectrometer factor and x-ray cross-section. Electron escape depth variations for different elements may be neglected. A 1 k electron volt Ar gun may be used for 60 seconds to remove hydrocarbon and hydroxyl surface contaminants absorbed/adsorbed by the substrate disk 124 during sample transfer in a laboratory or other facility.

Film microstructure achieved through use of the FIG. 1 apparatus may be analyzed by grazing angle x-ray diffraction (XRD) using, for example, a Rigaku D-MAXB thin film XRD system with a Cu Kα x-ray source; standard θ–2θ scans may be used. Some films achieved with the FIG. 1 apparatus have been analyzed for residual stress and mechanical characteristics. Stress is determined from the change in Si wafer curvature before and after deposition, using for example a Stoney equation wherein stress (G) is predicted by the relationship:

$$G=[E/(1-\gamma)]T^2/Gt\,[1/R-1/R_O] \qquad (1)$$

Where

E is elastic modulus (180 S Gpa)

γ is poison ratio (0.24)

Ro is curvature radius before deposition

R is curvature radius after deposition

T is substrate thickness t is film thickness.

Additional information regarding this Stoney equation prediction of stress is available in the publication of G. G. Stoney, Proceedings of the Royal Society, London A82, 1909, page 172.

The wafer elastic modulus is assumed to be 180.5 Gpa (giga Pascal) Substrate thickness is within 280–300 micrometers and measured for each wafer with 1 micrometer accuracy. Hardness and Young's modulus may be measured for films grown on steel disks with for example, a Nanoindenter IIs microprobe. A Berkovich indenter may be loaded to achieve an indentation depth of 100 nm at which hardness measurements are taken. Elastic modulus may be calculated from the upper unloading portions of load-displacement curves.

Deposition Method and Film properties

In exemplary uses of the FIG. 1 apparatus film chemical composition indicates the achieved films to be slightly under stoichiometric composition in oxygen content with respect to the $ZrO_2$+5 wt. % $Y_2$) $O_3$ stoichiometry formula. Oxygen deficiency decreases with increasing deposition temperature to 300° C., while the application of negative bias or changing from vacuum to low pressure Ar appears to not have an effect on film chemistry.

Figure 2:
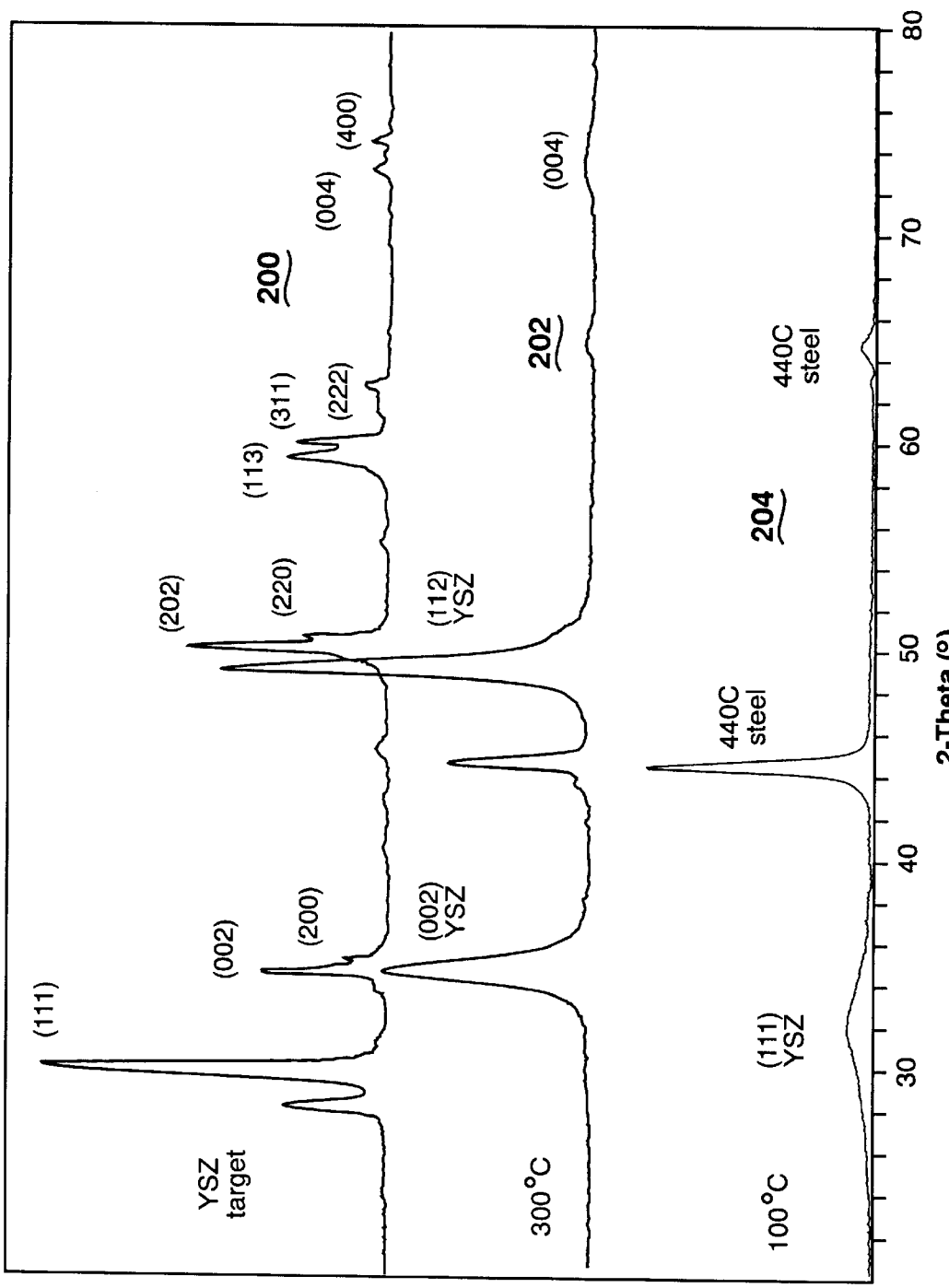
FIG. 2 shows grazing angle x-ray diffraction (XRD) spectra obtained for YSZ target surface and films produced at two different temperatures in a vacuum environment.

An increase in substrate temperature in the FIG. 1 ablation also changes film structure from nearly amorphous to completely crystalline. The first example data represented in the curves of FIG. 2 compares XRD spectra obtained for YSZ target surface and films produced in 100° C. and 300° C. depositions in vacuum. In these FIG. 2 curves the upper Target curve at 200 has randomly oriented polycrystalline structure, in which the main phase is tetragonal $ZrO_2$ with P4m2 symmetry. Films grown at 100° C. as at 204 in FIG. 2 have very broad (111) diffraction, indicating nearly amorphous structure. Other peaks in this spectrum 204 are from α-Fe in the 440 C. stainless-steel substrate. Films at 202 in FIG. 2 are grown at 300° C. and exhibit tetragonal (002) and (112) peaks with positions most closely related to distorted P42/nmc tetragonal symmetry. Thus, although the FIG. 2 film is crystalline its structure is not desirably singly [001] oriented and is strongly distorted from what would be a cubic $ZrO_2$. This FIG. 2 result serves as an example that temperature control is not an effective tool for producing single oriented [001] YSZ.

Figure 3:
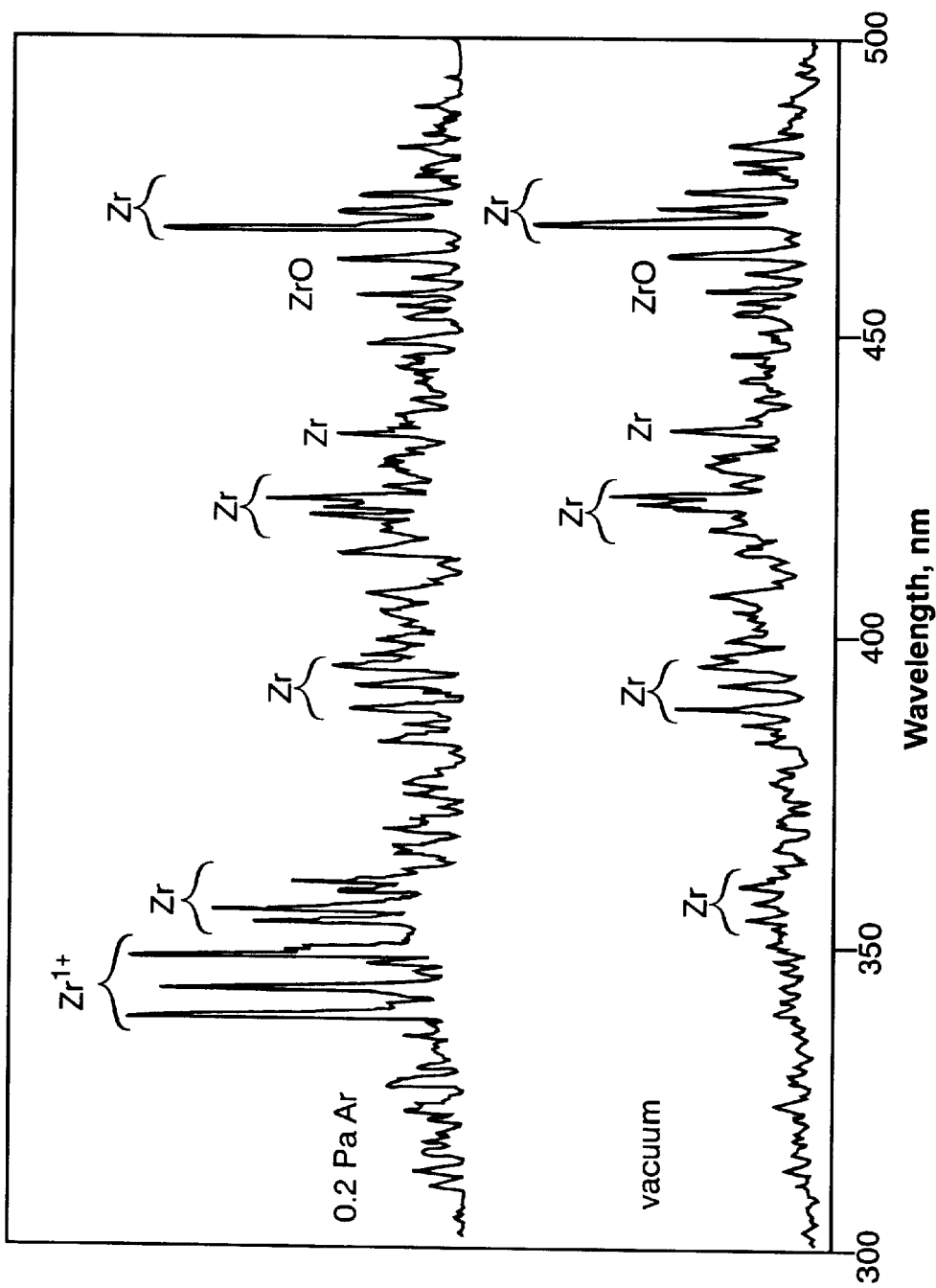
FIG. 3 shows the effect of Argon (Ar) presence on plume ionization for zirconia materials.

Film structure control with ion-bombardment under negative substrate bias requires the presence of a large quantity of positively charged ions. We have experimentally found that the ionization degree of ablated YSZ plumes can be orders of magnitude greater when low pressure Ar is used as a background gas in the FIG. 1 apparatus. This effect of Ar presence on plume ionization is shown in FIG. 3 of the drawings herein, where plasma spectroscopy data are compared for laser ablation in vacuum and in 0.2 Pa Ar. Notably the FIG. 3 described Argon environment considerably promotes generation of highly energetic $Zr^{1+}$ ions and also promotes $Zr^{1+}$ ion arrival at the substrate ahead of the remaining ablated material in the FIG. 1 process. These ions have on average a kinetic energy level of 100 electron volts. This generation of highly energetic $Zr^{1+}$ ions effect in fact creates a basis for using negative substrate potentials for structure control during a $Zr^{1+}$ ion bombardment sequence.

FIG. 1 apparatus depositions have been performed with YSZ film growth at negative bias conditions between 0 volts and 300 volts for 5–30 mTorr Ar and Ar/$O_2$ environments. (The 5–30 mTorr pressure range recited here corresponds to a pressure range of 0.7 to 4.0 Pascals; the above-recited 0.2 to 1.0 Pascal pressure range is nevertheless preferred.) Substrate temperature is preferably set at 100° C., a temperature easily maintained at a constant level notwithstanding process heating effects. Chemical analyses of achieved films indicate compositions of about 63–64 atomic % O, 33–34 atomic % Zr, and 2.5 atomic % Y, independently of the applied bias or the environment selection. Thus, observed structural changes are not affected by temperature or composition variations.

Figure 4:
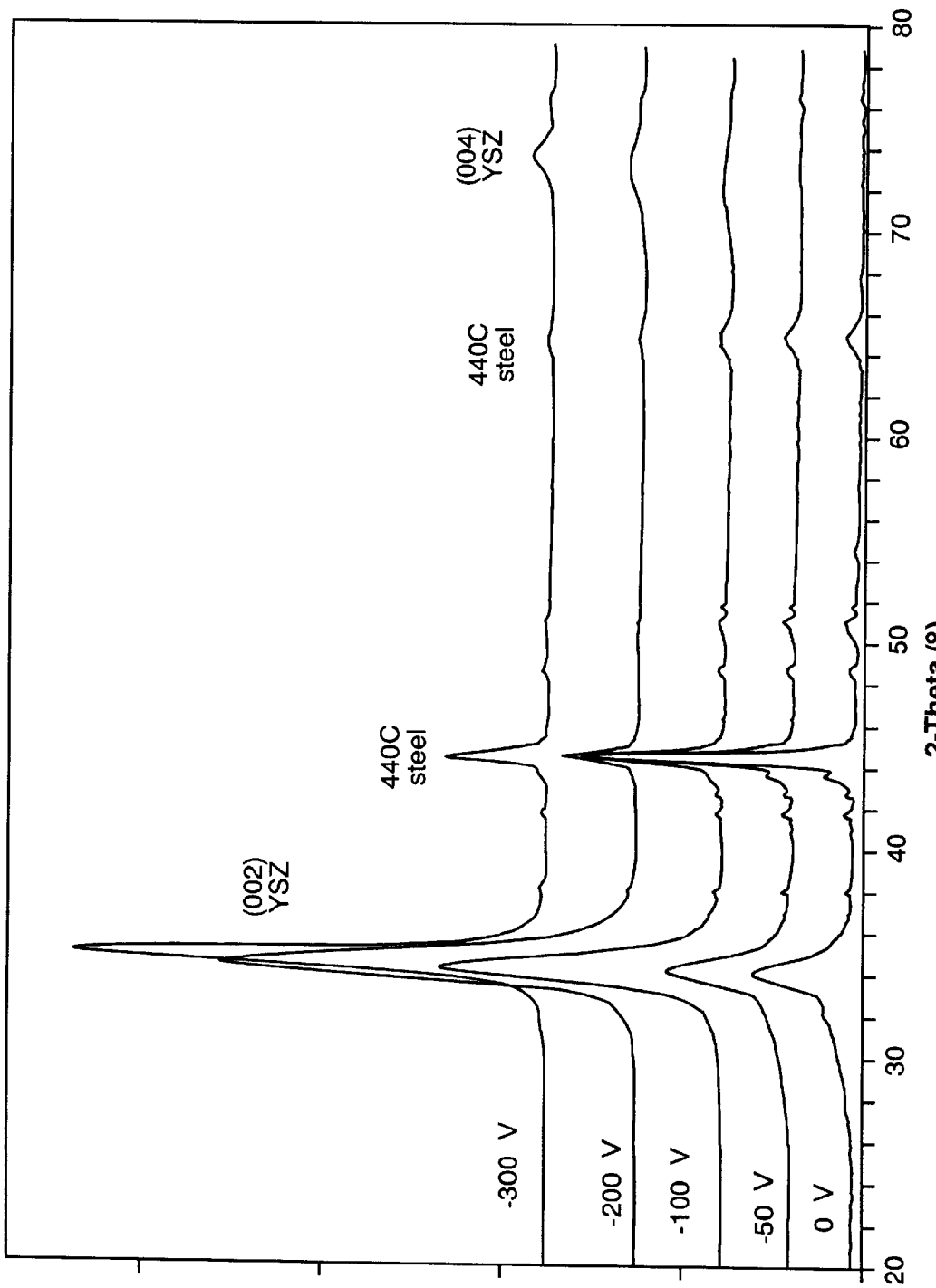
FIG. 4 compares grazing angle x-ray diffraction (XRD) difractograms for films grown in Ar at different values of substrate bias.

The desirable [001] oriented structure is much more strongly promoted for laser ablations accomplished in pure Ar or Ar/$O_2$ mixed environments, the latter having low oxygen fractions of less than 10%. In these environments a large fraction of $Zr^{1+}$ ions is generated and is available for bias acceleration. The curves of FIG. 4 in the drawings compare XRD difractograms for films grown in Ar at different values of substrate bias. An introduction of Ar without applying bias voltage is already desirable for its considerable diminishing of nearly amorphous (111) structure and development of (002) plane orientation. Moreover it is desirable to appreciate that the mean kinetic energy level of $Zr^{1+}$ ions produced by laser ablation of YSZ targets is estimated, from a time of flight study, to be about 100 electron volts. This provides the lower limit for ion bombardment energy in the present invention. When additional ion acceleration is supplied to this 100 electron volt level, with negative bias levels at or above 50 volts, we find that there is achieved only single [100] orientation for all deposited films.

Figure 5:
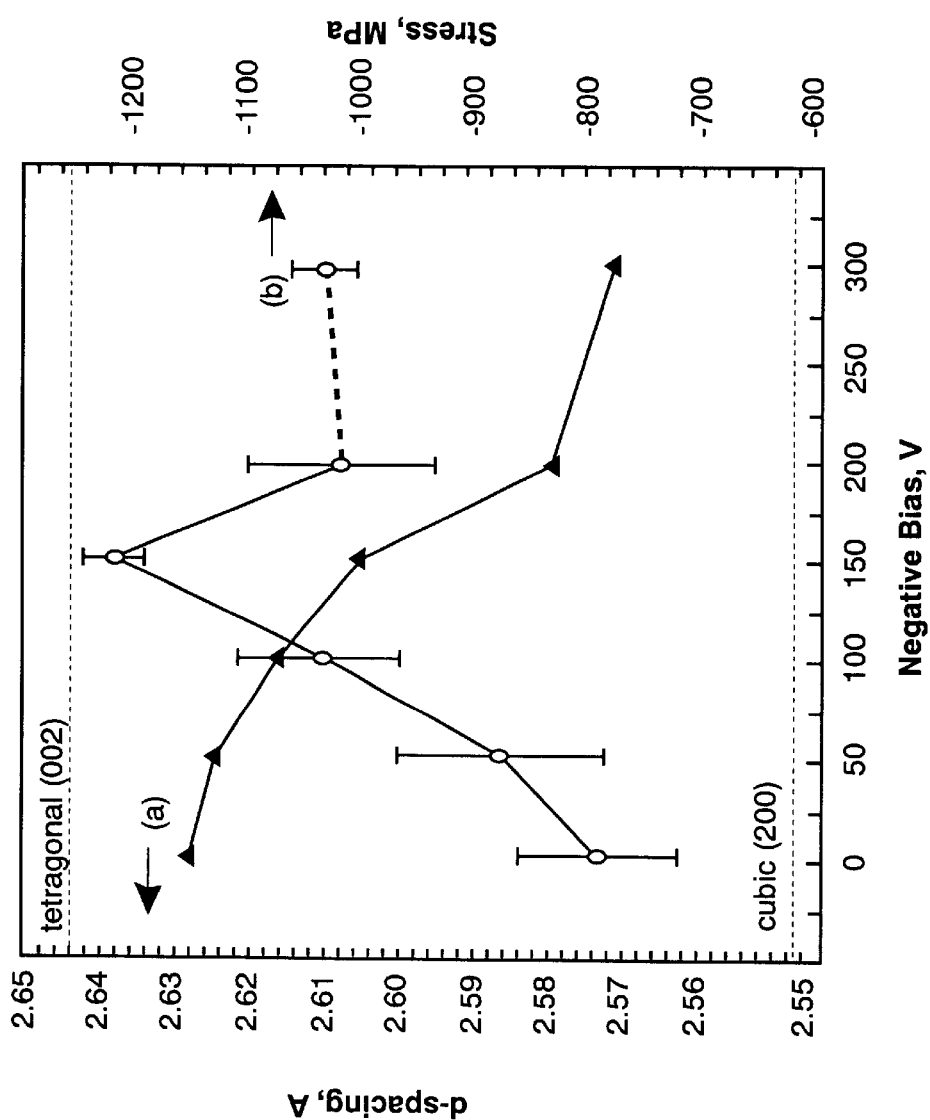
FIG. 5 shows two characteristics of YSZ films fabricated according to the present invention.

For such single axis oriented films it is somewhat difficult to distinguish, based on XRD spectra, between tetragonal structure with (002) interplanar spacing of d=0.260 nm and similarly oriented cubic structure with d=0.255 nm, for which the (200) symbolic is sometimes used in virtue of the cube symmetry. The exact position of the (002) peak may be found from peak fitting, and results used to plot d-spacing as a function of the bias voltage-as is shown in drawing FIG. 5 (curve a). The (002) spacing decreases with bias increase, indicating the tetragonal disproportion of crystal lattice is reduced. At the bias of above 100 volts there is an abrupt reduction of d to below 0.260 nm of tetragonal P4m2 structure, approaching a 0.255 nm value of cubic structure. Thus, the bias level of 100–200 volts is considered to be an optimum for use in the invention.

For film growth under ion bombardment and low temperature conditions, a large compressive stress within the film plane is normally to be expected. We have used substrate curvature analyses to estimate such stresses, making an assumption that the film is free to deform in the direction normal to the substrate. The results of this analysis are also presented in the FIG. 5 drawing (curve b). In the curve b data film stress has a maximum at the range of biases where an abrupt d-spacing occurs. Plane stresses are compressive and some lattice expansion in the direction normal to the substrate surface is expected, providing larger d spacing for (002) planes in comparison to standard values. The abrupt change at about 200 volts is related to the film structural change from tetragonal to cubic, providing stress relaxation.

Figure 6:
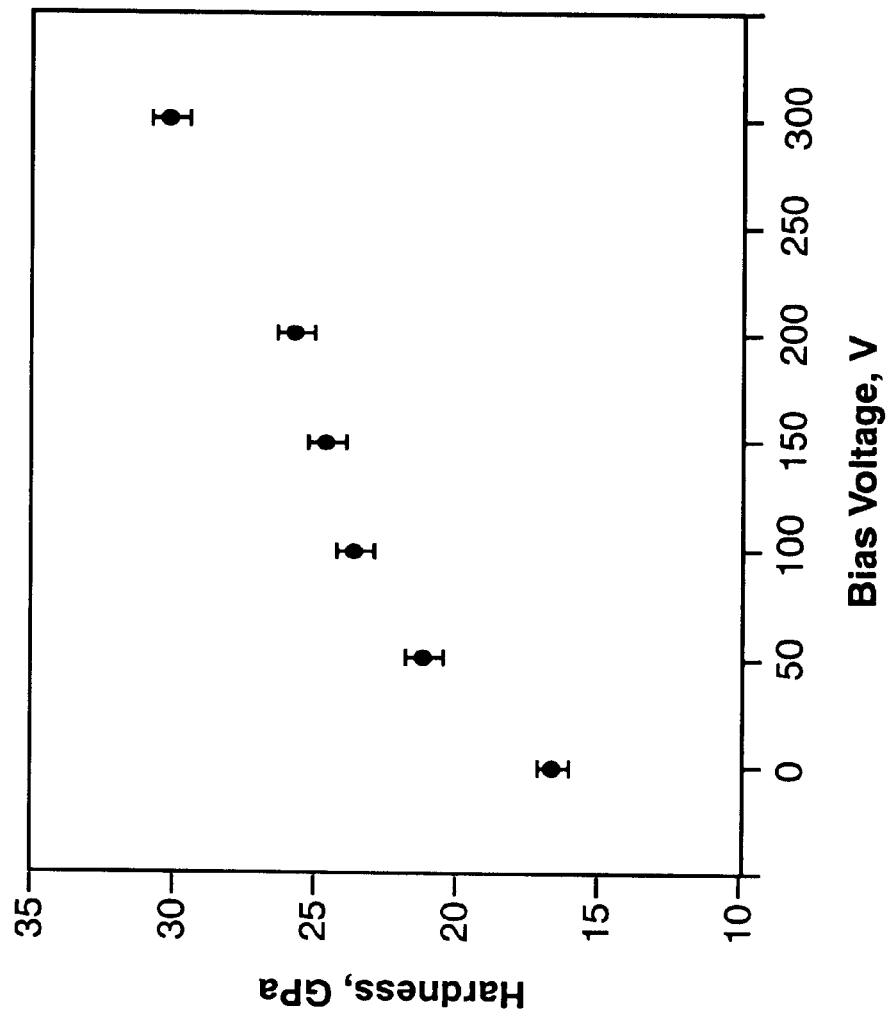
FIG. 6 shows hardness variation with change of applied bias during YSZ film fabrication.

An alternative possibility for stress relaxation may be stress annealing under the action of ion bombardment, but this is not supported in measuring film mechanical properties. FIG. 6 in the drawings shows hardness variation with change of applied bias and shows hardness monotonically increasing over the entire voltage range, reaching maximum values of about 30 GPa for 300 volts of film fabrication bias. The elastic modulus of the films increases in similar fashion from 240 GPa to 320 GPa. This value is above the 233 GPa modulus of single-crystal cubic YSZ, possibly due to the high compression stress in the film plane. Thus a decrease in d-spacing and a monotonic increase in film mechanical properties were assigned to the structural transition from tetragonal to cubic lattices, while maintaining [001] preferred orientation relative to the substrate surface.

Figure 7:
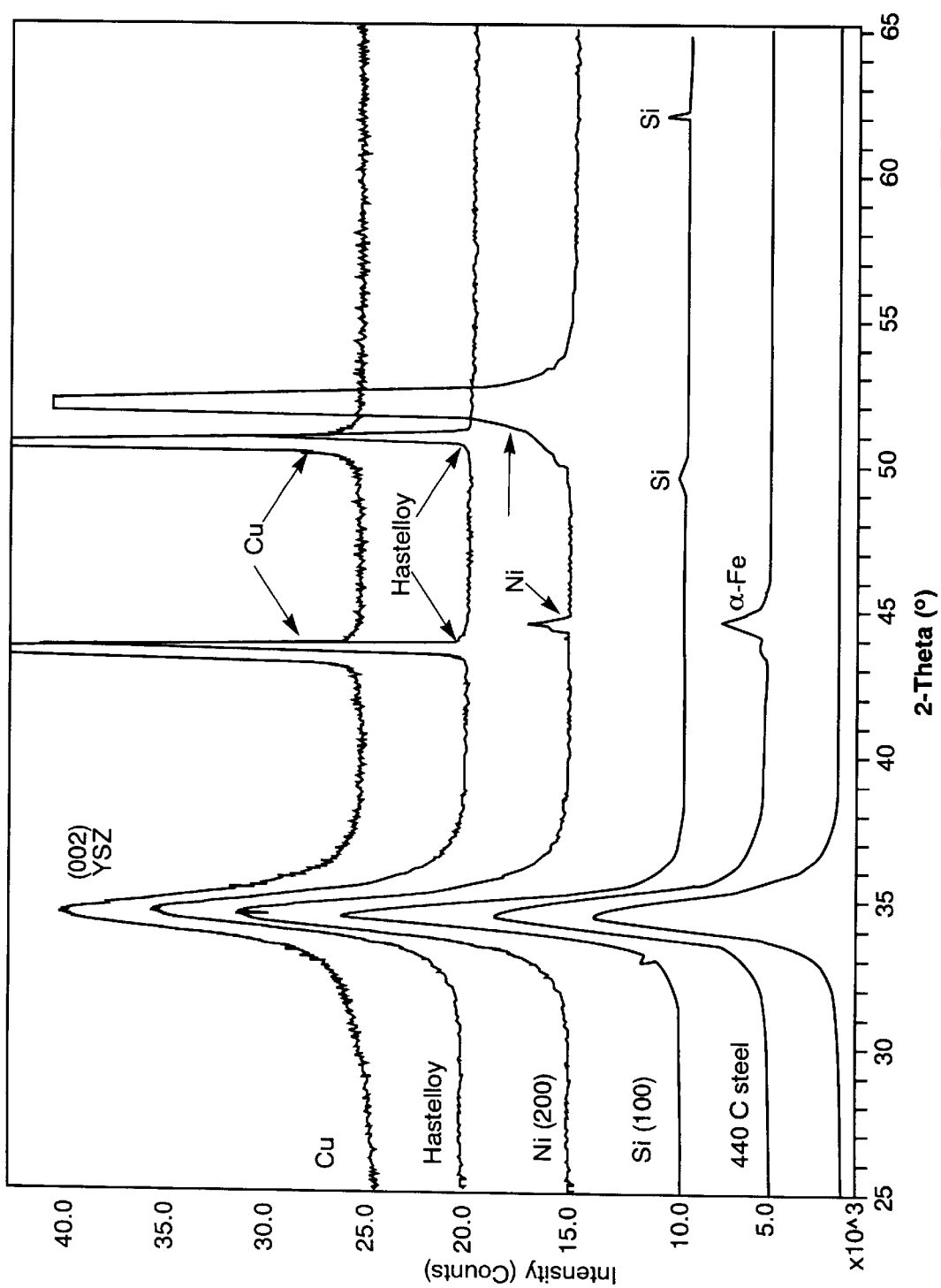
FIG. 7 shows the effect of different substrate materials on films formed according to the present invention.

A significant advantage of low temperature growth of YSZ films is that their structure is not dependent on the substrate surface characteristics. Thus, it is not necessary to use (200) textured Ni or Hastelloy substrates, to ensure [001] film orientation, as is done during high temperature depositions [11,12]. To demonstrate this concept we performed depositions on five different substrate materials: a single crystal Si wafer with [001] orientation, a (200) textured Ni material, a (200) textured Hastelloy material, a polycrystalline Cu. material, and a polycrystalline 440 C steel material. Depositions on all samples were performed in the same run utilizing continuous substrate motion through the laser ablated plasma region in an Ar environment and at the bias of 150 volts. XRD spectra obtained from the samples are identical in exhibiting (002) plane orientations as is represented in the FIG. 7 drawing. This result is believed significant for both superconductor and tribological applications, where the ability to grow such films on substrates made of polycrystalline and randomly oriented metals and on alloys is a desired feature.

Figure 8:
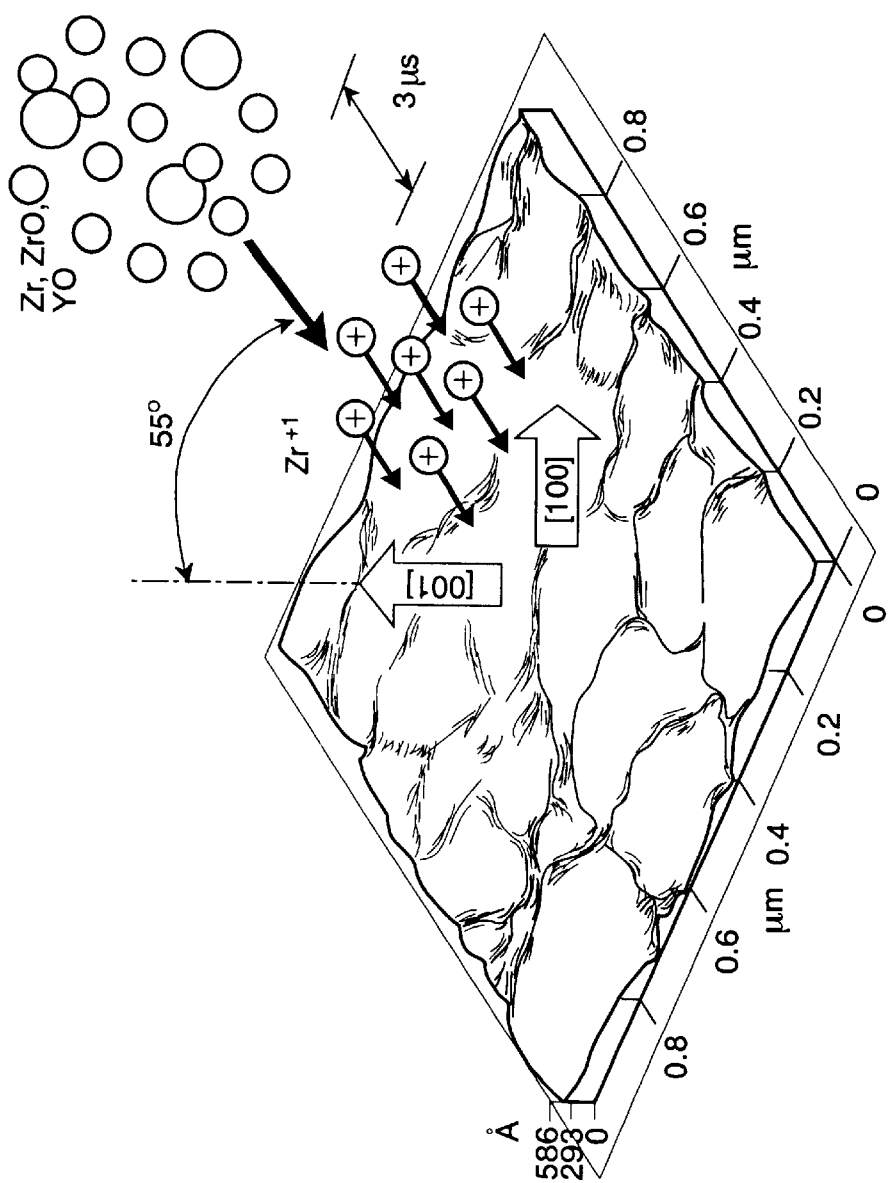
FIG. 8 shows the surface topology of a YSZ film formed according to the invention.

FIG. 8 shows the surface topology of a YSZ film formed according to the invention and also shows the preferred 55-degree inclination angle for the target-directed ions with respect to a normal to the substrate holder 120. As represented in the FIG. 8 drawing (a drawing originating in a microphotograph) large flat top crystals of 200–300 nanometer size are achieved when the preferred 55-degree inclination of the ions is selected. At a substrate inclination angle of zero degrees, as represented in the FIG. 1 drawing, smaller YSZ crystal sizes in the range of 50–150 nanometers are obtained. Other angles between and near these angles in size may also be useful in practicing the invention. FIG. 8 also shows a representation of the above-discussed temporal segregation between target-directed ion plumes.

Yttria stabilized zirconia (YSZ) films with [001] orientation relative to the substrate surface are therefore believed to be a desirable component for superconductor devices and for tribological applications. The currently used pulsed laser deposition technology for oriented YSZ growth has limitations due to either high deposition temperature or the need for ion-beam assistance, thereby restricting substrate material choice to (002) pre-textured substrates and increased process complexity. The present invention overcomes these difficulties by achieving YSZ [001] growth on any metal substrate at low substrate temperature and without use of an ion-beam source. The invention utilizes an experimentally discovered fact that YSZ target irradiation by an ultra-violet excimer laser in the presence of low pressure of Ar and/or Ar—$O_2$ environment creates a large quantity of single charged positive zirconium ions. Moreover the ion energy is not attenuated in the Knudsen layer at the target. These highly energetic ions arrive at the substrate ahead of the bulk of the material ablated from the target. The invention makes use of these ions for film structure control by accelerating them toward the condensation surface with a negative voltage supplied from a power supply. At the optimum environment pressure (5–30 mTorr) and optimum negative bias voltage (100–200 V) the fabricated YSZ films have only the [001] orientation. (The 5–30 mTorr pressure range recited here corresponds to a pressure range of 0.7 to 4.0 Pascals; the above-recited 0.2 to 1.0 Pascal pressure range is nevertheless preferred.) This invention permits the production of similar quality films on both (200) pre-textured and randomly oriented polycrystalline metal substrates at temperatures of about 100° C. and without ion-beam assistance.

The present invention can be applied to produce [001] oriented YSZ films for superconducting and tribological applications in military aircraft, missiles, and satellites. Superconductor applications include the production of metal wires coated with buffer layers of YSZ, which permit the deposition of properly aligned superconductor layers. The invention facilitates use of non-textured polycrystalline wires or tubes (copper, aluminum, nickel, etc.) which are easy to process and shape for access by a cooling liquid. Such long length wires are essential components of strong electro-magnetic field generators for particle accelerator guns, high power/low weight motors, long-range sensors, etc. Tribological applications include components of high precision low noise friction pairs for various positioning and fast re-targeting devices, bearings, gyroscopes, etc. Especially important applications are space-based devices, where the low frictional noise and long wear life are of paramount importance. Other applications may include atomically smooth sliding surfaces for MEMS applications.

The present invention can also be applied to produce [001] oriented YSZ films for super conducting and tribological applications in medical, automotive, commercial aircraft, and telecommunication uses. Superconductor applications include power generation, high-efficiency transformers, particle accelerator and imaging for medical devices, high power/low weight motors for automotive and commercial aircraft industry, telecommunication and cellular technology, low friction and low noise tribological pairs in satellite communication systems, etc.

While the apparatus and method herein described constitute a preferred embodiment of the invention, it is to be understood that the invention is not limited to this precise form of apparatus or method and that changes may be made therein without departing from the scope of the invention which is defined in the appended claims.

REFERENCES

1. D. K. Fork, D. B. Fenner, G. A. N. Connel, J. M. Phillips, T. H. Genalle, Applied Physic Letters 57 (1990) 1137.
2. R. P. Reade, X. L. Mao, R. E. Russo, Applied Physic Letters 59 (1991) 739.
3. P. N. Arendt, S. R. Foltyn, J. R. Grpves, R. F. Depaula, P. C. Dowden, J. M. Roper, and J. Y. Coulter, Applied Superconductivity, 4 (1996) 429.
4. Chudzik, M. P.; Lanagan, M. T.; Kannewurf, C. R., IEEE Trans. Appl. Supercond., 9 (1999) 1490.
5. M. S. Miller, W. L. Skelcher, P. B. Narayan, G. T. Swami, J. Crist, R. L. Peterson, R. R. Thomas, and H. F. Erskine, J. Applied Physics, 67 (1990) 4872.
6. M. T. Dugger, Y.-W. Chung, B. Bhushan, W. Rothschild, Tribol. Trans. 36 (1993) 84.
7. S. C. Moulzolf, R. J. Lad, and P. J. Blau, Thin Solid Films, 347 (1999) 220.
8. A. Sheth, H. Schmidt, and V. Lasrado, Appl. Supercond., 6 (1998) 855.
9. F. Goerke, Physica C, 245 (1995) 15.
10. Q. X. Jia, X. D. Wu, D. S. Zhou, S. R. Foltyn, P. Tiwari, D. E. Peterson, and T. E. Mitchell, Philosophical Magazine Letters, 72 (1995) 385.
11. Y. S. Jeong, J. H. Park, S. Y. Lee, Thin Solid Films, 318 (1998) 262–264.

12. C.-Y. Yang, S. E. Babcock, A. Goyal, M. Paranthaman, F. A. List, D. P. Norton, D. M. Kroeger, A. Ichinose, Physica C, 307 (1998) 87.
13. K. Hasegawa, K. Fujino, H. Mukai, M. Konishi, K. Hayashi, K. Sato, S. Honjo, Y. Sato, H. Ishii, and Y. Iwata, Apppl. Superconductivity 4 (1996) 487.
14. W. A. Quinton, W. Y. Liang, F. Baudenbacher, D. T. Foord, A. P. Bramley, and S. B. Newcomb, *IEEE Trans. Appl. Superconductivity,* 19 (1999) 1498.
15. Y. Iijima, N. Tanabe, O. Kohno, Y. Ikeno, J. Appl. Phys. Lett. 60 (1992) 769.
16. R. P. Reade, S. R. Church, and R. E. Russo, Rev. Sci. Instrum. 66 (1995) 3610.
17. Y. Iijima, M. Hosaka, N. Tanabe, N. Sadakata, T. Saitoh, O. Kohno, and K. Takeda, J. Mater. Res., 13 (1998) 3106.
18. J. Wiesmann, J. Dzick, J. Hoffmann, K. Heinemann, H. C. Freyhardt, J. Mater. Res., 13 (1998) 3149.

What is claimed is:

1. The laser ablation method of forming oriented yttria stabilized zirconia films comprising the steps of:
    disposing a target source of polycrystalline yttria stabilized zirconia in a closed atmosphere of selected gaseous composition, flow rate, temperature and pressure;
    locating a film-receiver substrate of selected composition in said closed atmosphere of selected gaseous composition, flow rate, temperature and pressure;
    ablating, in an argon-inclusive atmosphere, a segregated plume of zirconium ions and remainder plasma from a surface portion of said polycrystalline yttria stabilized zirconia target source using energy emissions from a laser of selected operational characteristics;
    said substrate being disposed in a selected angular orientation with respect to a straight line path joining said substrate and said target source of polycrystalline yttria stabilized zirconia;
    attracting said zirconium ions and said remainder plasma toward said substrate by lowering said substrate in electrical potential below that of said polycrystalline yttria stabilized zirconia target source.

2. The laser ablation method of forming oriented yttria stabilized zirconia films of claim 1 wherein said plume of zirconium ions and remainder plasma has a plume duration of five to ten microseconds.

3. The laser ablation method of forming oriented yttria stabilized zirconia films of claim 1 wherein said selected angular orientation comprises an angle of fifty five degrees between substrate-directed ions and a substrate normal.

4. The laser ablation method of forming oriented yttria stabilized zirconia films of claim 1 wherein said selected angular orientation comprises an angle in the range of zero to fifty five degrees between substrate-directed ions and a substrate normal.

5. The laser ablation method of forming oriented yttria stabilized zirconia films of claim 1 wherein said laser of selected operational characteristics is a pulsed excimer laser of ultraviolet wavelength energy output.

6. The laser ablation method of forming oriented yttria stabilized zirconia films of claim 5 wherein said laser of selected operational characteristics has a major output spectral line at 248 nanometers of wavelength, an energy output of two hundred to one thousand millijoules, a pulse duration of fifteen to twenty nanoseconds and a pulse repetition rate of ten to one hundred Hertz and provides a surface energy density of ten to fifty joules per square centimeter on said target source of polycrystalline yttria stabilized zirconia.

7. The laser ablation method of forming oriented yttria stabilized zirconia films of claim 1 wherein said ablated plume of zirconium plasma is comprised of zirconium ions, excited zirconium atoms, excited zirconia oxide and excited yttrium oxide components.

8. The laser ablation method of forming oriented yttria stabilized zirconia films of claim 7 wherein said ablated plume of zirconium plasma is comprised of zirconium ions, segregated in time and space from remainder portions of said ablated plume.

9. The laser ablation method of forming oriented yttria stabilized zirconia films of claim 8 wherein said ablated plume of zirconium plasma is comprised of zirconium ions, segregated by a time interval and by spatial separation from remainder portions of said ablated plume and wherein said method further includes the step of:
    reconstructing a surface formed on said substrate by said remainder portions of a first ablated plume prior to arrival of remainder portions of a second ablated plume;
    said reconstructing step being preceded by and enabled by an intervening arrival of said zirconium ion portion of said second ablated plume.

10. The laser ablation method of forming oriented yttria stabilized zirconia films of claim 9 wherein said reconstructing of a surface formed on said substrate by said remainder portions of an ablated plume occurs during said time interval.

11. The laser ablation method of forming oriented yttria stabilized zirconia films of claim 9 wherein said target and said substrate are physically separated by a distance of between two and thirteen centimeters said time interval of reconstructing is between one and five microseconds in duration for each of said ablated plumes.

12. The ion beam free, low temperature method of fabricating oriented yttria stabilized zirconia films comprising the steps of:
    forming, in an argon-inclusive atmosphere, an isolated environment pulsed laser ablation segregation plume of zirconium ions and remainder plasma from a laser target quantum of yttria stabilized zirconia material;
    accelerating said zirconium ions from said plume toward a film carrier substrate member in a substrate ion bombardment sequence;
    enhancing said accelerated ion bombardment sequence with application of an ion attracting negative electrical potential to said film carrier substrate member;
    covering an atomic layer of zirconia formed by said accelerated bombardment sequence zirconium ions on said film carrier substrate member with a yttria stabilized zirconia layer formed from said ablation plume remainder plasma;
    repeating said sequence of steps until a selected thickness of said oriented yttria stabilized zirconia film is achieved on said substrate.

13. The ion beam free, low temperature method of fabricating oriented yttria stabilized zirconia films of claim 12 wherein said yttria stabilized zirconia layer formed from said ablation plume remainder plasma is comprised of excited zirconium, excited oxygen, excited zirconium oxide and excited yttrium oxide remainder components.

14. The ion beam free, low temperature method of fabricating oriented yttria stabilized zirconia films of claim 12 further comprising the step of:
    enhancing said pulsed laser ablation plume of zirconium ions and remainder plasma by performing said forming step in an isolated low-pressure atmosphere of argon gas.

15. The ion beam free, low temperature method of fabricating oriented yttria stabilized zirconia films of claim 12 wherein said step of forming an isolated environment pulsed laser ablation plume of zirconium ions and remainder plasma from a target quantum of yttria stabilized zirconia material includes disposing said zirconium ions in temporal and spatial segregation with respect to said remainder plasma.

16. The method of forming oriented yttria stabilized zirconia films comprising the steps of:

mounting a target source of yttria stabilized zirconia in an isolated atmosphere;

fixing a substrate of selected composition in said isolated atmosphere;

bombarding said substrate of selected composition with ions from said target source of yttria stabilized zirconia by ablating, in an argon-inclusive atmosphere, successive segregated plumes of ions from said target source using pulsed laser sourced energy;

said bombarding step also including accelerating successive groups of ablated ions onto said substrate with negative substrate electrical potential bias;

enhancing an ionization degree of said amorphous yttria stabilized zirconia target material into said successive plumes of ions by optimizing both content and physical parameters of said isolated atmosphere.

17. The method of forming oriented yttria stabilized zirconia films of claim 16 wherein said target source of yttria stabilized zirconia consists of one of an amorphous and a polycrystalline compositions.

18. The method of forming oriented yttria stabilized zirconia films of claim 16 wherein said step of bombarding said substrate by ablating successive plumes of ions from said target source and by accelerating successive groups of ablated ions includes accelerating said ablated ions from an ablation-determined energy level to a final surface reconstruction greater energy level using said negative substrate electrical potential bias.

19. The method of forming oriented yttria stabilized zirconia films of claim 16 wherein said step of bombarding said substrate of selected composition with ions from said target source of yttria stabilized zirconia by ablating successive plumes of ions from said target source using pulsed laser sourced energy and by accelerating successive groups of ablated ions onto said substrate with negative substrate electrical potential bias includes accelerating said ablated ions from an ablation-sourced energy level near one hundred electron volts to an energy level near three hundred electron volts using said negative substrated electrical potential bias.

20. The method of forming oriented yttria stabilized zirconia films of claim 16 wherein said step of enhancing an ionization degree of said amorphous yttria stabilized zirconia target material into said successive plumes of ions by optimizing both content and physical parameters of said isolated atmosphere includes providing an isolated atmosphere pressure of 0.2 to 1.0 Pascal of one of an Argon and an Argon and Oxygen mixture.

21. The method of forming oriented yttria stabilized zirconia films of claim 16 wherein said films are grown by laser ablation of a $ZrO_2/5$ weight % $Y_2O_3$ target with a 248 nanometers wavelength laser beam from an excimer laser of 250 millijoules energy level, 17 nanoseconds pulse duration, 40 Hertz repetition rate, pulse energy density of 10 Joules per square centimeter and a laser beam incidence angle of about 35 degrees to a target surface area.

22. The method of forming oriented yttria stabilized zirconia films of claim 16 wherein said target source of yttria stabilized zirconia consists of polycrystalline yttria stabilized zirconia.

23. The method of forming oriented yttria stabilized zirconia films of claim 22 wherein said bombarding step including accelerating successive groups of ablated ions onto said substrate with negative potential substrate electrical bias includes bombarding each successive layer of said film with subsequently arriving physically and temporally segregated ions of said plume.

24. The method of forming oriented yttria stabilized zirconia films of claim 16 wherein said negative substrate electrical potential bias has a magnitude between zero volts and three hundred volts.

25. The method of forming oriented yttria stabilized zirconia films of claim 24 wherein said negative substrate electrical potential bias has a magnitude between one hundred and two hundred volts.

26. The laser ablation low temperature method of growing substrate surface-independent, [001] oriented, yttria stabilized zirconia film of selected crystal size on a substrate surface, said method comprising the steps of:

forming a controlled environment pulsed ultraviolet laser-achieved plume of ablated zirconium ions and remainder plasma adjacent a yttria stabilized zirconia laser target;

said plume of ablated zirconium ions and remainder plasma being formed in spatial segregation at a temperature below three hundred degree Celsius and in an argon-inclusive environment;

accelerating said zirconium ions from said plume toward said substrate surface in a substrate surface ion bombarding sequence;

said accelerating step including enhancing said accelerated ion bombardment of said substrate surface by holding said substrate surface at a selected ion attracting negative electrical potential and controlled environment pressure favoring said [001] orientation;

covering an atomic layer of zirconia formed by said accelerated bombarding of said substrate member surface with a subsequently arriving yttria stabilized zirconia layer formed from said ablation plume remainder plasma;

repeating said accelerating and covering steps until a selected thickness of [001] oriented yttria stabilized zirconia film is achieved on said substrate surface.

27. The low temperature laser ablation method of grouping substrate surface-independent [001] oriented yttria stabilized zirconia film of claim 26 wherein said substrate is comprised of one of the materials of 200 textured Nickel, 200 textured nickel-chromium, single crystal silicon, polycrystalline copper and polycrystalline steel.

28. The low temperature laser ablation method of growing substrate surface-independent [00] oriented yttria stabilized zirconia film of claim 26:

further including the step of disposing said yttria stabilized zirconia laser target at a selected angle of between zero and fifty five degrees inclination with respect to a normal to said substrate; and wherein said yttria stabilized zirconia film is comprised of crystals of between fifty and three hundred nanometers nominal crystal size in response to said selected angle.

29. The low temperature laser ablation method of growing substrate surface-independent [001] oriented yttria stabilized zirconia film of claim 26 wherein:

said controlled temperature is between fifty and three hundred degree Celsius;

said argon-inclusive controlled environment includes a pressure of between two tenths and one Pascal;

said selected electrical potential is a negative potential of between one hundred and two hundred volts.

30. The low temperature laser ablation method of growing substrate surface-independent [001] oriented yttria stabilized zirconia film of claim 26 wherein:

said forming step includes forming a controlled environment pulsed ultraviolet laser-achieved plume of ablated zirconium ions and a remainder plasma inclusive of molecular zirconia, molecular yttria, neutral zirconium, excited zirconium, excited yttrium atoms and excited oxygen atoms; and said covering step includes covering an atomic layer of oriented zirconia formed by said accelerated bombarding of said substrate member surface with a subsequently arriving yttria stabilized non oriented zirconia layer formed from said ablation plume remainder plasma.

* * * * *